(12) United States Patent
Beintner et al.

(10) Patent No.: US 7,018,551 B2
(45) Date of Patent: Mar. 28, 2006

(54) PULL-BACK METHOD OF FORMING FINS IN FINFETS

(75) Inventors: Jochen C. Beintner, Wappingers Falls, NY (US); Dureseti Chidambarrao, Weston, CT (US); Yujun Li, Poughkeepsie, NY (US); Kenneth T. Settlemyer, Jr., Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 10/730,234

(22) Filed: Dec. 9, 2003

(65) Prior Publication Data

US 2005/0121412 A1    Jun. 9, 2005

(51) Int. Cl.
*B44C 1/22* (2006.01)
(52) U.S. Cl. .................. 216/11; 438/157; 438/164; 438/284; 438/696; 257/365; 257/401
(58) Field of Classification Search .............. 216/11; 438/157, 283, 481, 149, 284, 696, 164, 745, 438/720, 721; 257/365, 401, 347, 368, E21.235, 257/E21.236, E21.442, E29.137, E29.299
See application file for complete search history.

(56) References Cited

U.S. PATENT DOCUMENTS

| 6,391,782 | B1 * | 5/2002 | Yu .............................. 438/696 |
| 6,417,047 | B1 * | 7/2002 | Isobe .......................... 438/258 |
| 2004/0266076 | A1 * | 12/2004 | Doris et al. .................. 438/157 |

* cited by examiner

Primary Examiner—Nadine G. Norton
(74) Attorney, Agent, or Firm—Eric W. Petraske

(57) ABSTRACT

A method of forming integrated circuits having FinFET transistors includes a method of forming sub-lithographic fins, in which a mask defining a block of silicon including a pair of fins in reduced in width or pulled back by the thickness of one fin on each side, after which a second mask is formed around the first mask, so that after the first mask is removed, an aperture remains in the second mask having the width of the separation distance between the pair of fins. When the silicon is etched through the aperture, the fins are protected by the second mask, thereby defining fin thickness by the pullback step. An alternative method uses lithography of opposite polarity, first defining the central etch aperture between the two fins lithographically, then expanding the width of the aperture by a pullback step, so that filling the widened aperture with an etch-resistant plug defines the outer edges of the pair of fins, thereby setting the fin width without an alignment kstep.

26 Claims, 8 Drawing Sheets

PULL-BACK METHOD OF FORMING FINS IN FINFETS

TECHNICAL FIELD

The field of the invention is that of fabricating field effect transistors having a body extending perpendicular to the semiconductor substrate between horizontally disposed source and drain regions, referred to as a "FinFET".

BACKGROUND OF THE INVENTION

Metal-Oxide-Semiconductor field effect transistor (MOSFET) technology is the dominant electronic device technology in use today. Performance enhancement between generations of devices is generally achieved by reducing the size of the device, resulting in an enhancement in device speed. This is generally referred to as device "scaling".

Ultra-large-scale integrated (ULSI) circuits generally include a multitude of transistors, such as more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. The transistors can be N-channel MOSFETs or P-channel MOSFETs.

In bulk semiconductor-type devices, transistors such as MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of depletion layer below the inversion channel) must be scaled down to achieve superior short-channel performance.

As MOSFETs are scaled to channel lengths below 100 nm, conventional MOSFETs suffer from several problems. In particular, interactions between the source and drain of the MOSFET degrade the ability of the gate to control whether the device is on or off. This phenomenon is called the "short-channel effect".

Silicon-on-insulator (SOI) MOSFETs are formed with an insulator (usually, but not limited to, silicon dioxide) below the device active region, unlike conventional "bulk" MOSFETs, which are formed directly on silicon substrates, and hence have silicon below the active region.

Conventional SOI-type devices include an insulative substrate attached to a thin-film semiconductor substrate that contains transistors similar to the MOSFETs described with respect to bulk semiconductor-type devices. The insulative substrate generally includes a buried insulative layer above a lower semiconductor base layer. The transistors on the insulative substrate have superior performance characteristics due to the thin-film nature of the semiconductor substrate and the insulative properties of the buried insulative layer. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variations in small size transistors), near-ideal subthreshold voltage swing (i.e., good for low off-state current leakage), and high saturation current. SOI is advantageous since it reduces unwanted coupling between the source and the drain of the MOSFET through the region below the channel. This is often achieved by ensuring that all the silicon in the MOSFET channel region can be either inverted or depleted by the gate (called a fully depleted SOI MOSFET). As device size is scaled, however, this becomes increasingly difficult, since the distance between the source and drain is reduced, and hence, they increasingly interact with the channel, reducing gate control and increasing short channel effects (SCE).

The double-gate MOSFET structure is promising since it places a second gate in the device, such that there is a gate on either side of the channel. This allows gate control of the channel from both sides, reducing SCE. Additionally, when the device is turned on using both gates, two conduction ("inversion") layers are formed, allowing for more current flow. An extension of the double-gate concept is the "surround-gate" or "wraparound-gate" concept, where the gate is placed such that it completely or almost-completely surrounds the channel, providing better gate control.

In accordance with the invention a method is provided for fabricating a double gate field effect transistor (FinFET) which is compatible with conventional MOSFET fabrication processes. The device channel comprises a thin silicon fin standing on an insulative layer (e.g. silicon oxide) with the gate in contact with the sides of the fin. Thus inversion layers are formed on the sides of the channel with the channel film being sufficiently thin such that the two gates control the entire channel film and limit modulation of channel conductivity by the source and drain.

The double gates on the channel fin effectively suppress SCE and enhance drive current. Further, since the fin is thin, doping of the fin is not required to suppress SCE and undoped silicon can be used as the device channel, thereby reducing mobility degradation due to impurity scattering. Further, the threshold voltage of the device may be controlled by adjusting the work function of the gate by using a silicon-germanium alloy or a refractory metal or its compound such as titanium nitride.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

Heretofore, lithographic tools are utilized to form transistors and other structures on the integrated circuit. For example, lithographic tools can be utilized to define gate conductors, active lines conductive lines, vias, doped regions, and other structures associated with an integrated circuit. Most conventional lithographic fabrication processes have only been able to define structures or regions having a dimension of 100 nm or greater.

In one type of conventional lithographic fabrication process, a photoresist mask is coated over a substrate or a layer above the substrate. The photoresist mask is lithographically patterned by providing electromagnetic radiation, such ultraviolet light, through an overlay mask. The portions of the photoresist mask exposed to the electromagnetic radiation react (e.g. are cured). The uncured portions of the photoresist mask are removed, thereby transposing the pattern associated with the overlay to the photoresist mask. The patterned photoresist mask is utilized to etch other mask layers or structures. The etched mask layer and structures, in turn, can be used to define doping regions, other structures, vias, lines, etc.

As the dimensions of structures or features on the integrated circuit reach levels below 100 nm or 50 nm, lithographic techniques are unable to precisely and accurately define the feature. For example, as described above, reduction of the width of the gate conductor (the gate length) associated with a transistor or of the active lines associated with an SOI transistor has significant beneficial effects. Future designs of transistors may require that the active lines have a width of less than 50 nanometers.

Double gate SOI MOSFETs have received significant attention because of its advantages related to high drive current and high immunity to short channel effects. The double-gate MOSFET is able to increase the drive current because the gate surrounds the active region by more than one layer (e.g., the effective gate total width is increased due to the double gate structure). However, patterning narrow, dense active regions is challenging. As discussed above with respect to gate conductors, conventional lithographic tools are unable to accurately and precisely define active regions as structures or features with dimensions below 100 nm or 50 nm.

Thus, there is a need for an integrated circuit or electronic device that includes smaller, more densely disposed active regions or active lines. Further still, there is a need for a ULSI circuit which does not utilize conventional lithographic techniques to define active regions or active lines. Even further still, there is a need for a non-lithographic approach for defining active regions or active lines having at least one topographic dimension less than 100 nanometers and less than 50 nanometers (e.g., 20–50 nm). Yet further still, there is a need for an SOI integrated circuit with transistors having multiple sided gate conductors associated with active lines having a width of about 20 to 50 nm.

The present invention is directed to a process for fabricating FinFET transistor structures which is an extension of conventional planar MOSFET technology and resulting structures.

SUMMARY OF THE INVENTION

The present invention is directed to a process for fabricating FinFET transistor structures, in which the vertical silicon slices that contain the transistor body (referred to as fins) are defined in a self-aligned fashion relative to a block of silicon, so that the fin width does not depend on tolerances in alignment, but on a material removal process.

A feature of the invention is the definition of a set of blocks of silicon that will be processed to form two fins for FinFET transistors.

Another feature of the invention is the removal from an oversized block of silicon of material between the final locations of fins, leaving the fins remaining as the un-etched material.

Another feature of the invention is a self-aligned process in which a hardmask is reduced in width by an amount that will be the width of the fins, so that the width of the fins is determined by the material removal process.

Yet another feature of the invention is a process in which a first hardmask is formed with a width that will be discarded and a second hardmask is formed by deposition of a conformal material about the first hardmask

DETAILED DESCRIPTION

This invention describes a process for forming controlled, thin body fins for a FinFET device, in which the uniformity of the thickness of the fins does not depend on alignment of a stepper. The process uses a pullback step that defines the width of the hardmask that sets the thickness of the fin. Thickness control of the fin body is a critical factor in the fabrication process, as it directly results in FET threshold variation.

This specification describes two integration schemes of the pullback fin process, the first scheme is implemented in a self-aligned source/drain process flow and the second in a source/drain block process flow.

In each case, the starting point is a SOI or bulk silicon wafer. In the case of a SOI wafer, the fin height will be determined by the thickness of the silicon. The layer of semiconductor that contains the fins will be referred to as the fin layer, whether the substrate is bulk or SOI.

Figure 1:
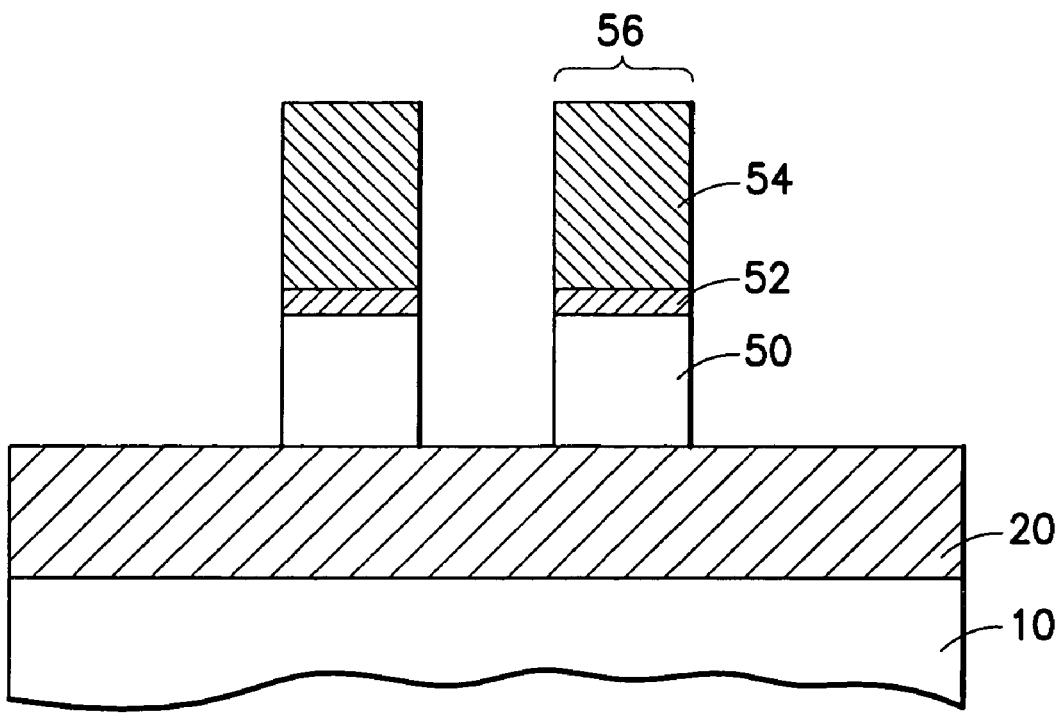
FIG. 1 shows in cross section a preliminary step in the process of forming the invention, showing silicon blocks that will each form two fins.

Referring now to FIG. 1, there is shown in cross section a portion of an integrated circuit that will contain a set of FinFET transistors. Wafer 10 may be bulk silicon or an SOI wafer. The SOI wafer is preferred and is illustrated here. Above substrate 10, buried oxide insulator (BOX) layer 20 has been formed by conventional processes. Sitting on top of BOX 20 are blocks of silicon 50 extending perpendicular to the plane of the paper that will form the fins of FinFETs. The plane of the cross section is taken through the location where transistor gates will be placed in later steps. The horizontal dimensions appearing in the cross section will be referred to as transverse dimensions.

Blanket implants may be done at any convenient time.

Illustrative ranges for the SOI silicon thickness are 100 Å to 2000 Å. A thermal oxide 52 is grown to a thickness of 300 Å (ranging between 50Å–1000 Å) on the surface of the silicon using thermal diffusion processes. Alternatively the oxide can be deposited with the same thickness using CVD processes. A CVD nitride cap 54 is deposited on the oxide with a thickness of 1000 Å (Range 300Å–2000 Å).

The oxide/nitride stack shown in FIG. 1 has been lithographically structured to define silicon blocks. With the resist in place, the nitride and the oxide are etched in a first RIE plasma etch, then the silicon is etched in a second RIE plasma etch with the nitride 54 masking the silicon layer 50. Whether any resist remains after the first etch will depend on details of the process parameters. The width of the structure is shown as bracket 56 in FIG. 1. The etching chemistry and parameters are conventional, well known to those skilled in the art. It is important that both etches are very straight, as is conventional in the art, so that sidewall angles close to 90 degree are generated. Significant variation in the angle of the vertical faces will result in thickness variation of the fins and thus of the transistor bodies.

In the case of SOI wafers, the silicon etch is a conventional etch that is selective to oxide and stops on the BOX (Buried oxide). In the case of bulk silicon the silicon etch is timed. The result of forming silicon fin blocks is shown in FIG. 1. At this point it is also possible to do any kind of one-sided fin processing, e.g. ion implantation, thereby adding an additional degree of freedom for FinFET device design.

Figure 4:
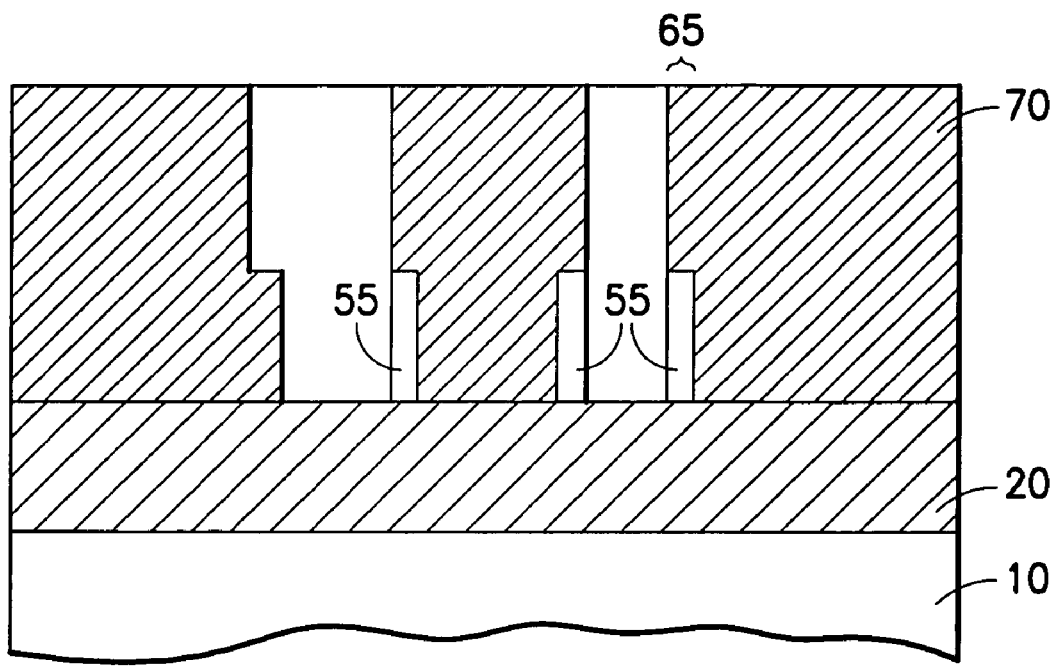
FIG. 4 shows the area after etching out the blocks to form the fins.

The term "one-sided" is used because the left and right vertical surfaces of each block 50 will become corresponding sides of separate fins in the final structure. The opposite sides of the fins are at this stage buried within blocks 50. FIG. 4 shows the first exposure of the other sides of the final fins. If ion implantation were used at this time, only the vertical surfaces shown in FIG. 1 would be affected because the portion of block 50 that will become the second exposed surface of a fin is covered. This could be used to make the channel or threshold on one side of the FinFET different from that on the other side.

In the following steps, the central portion of the silicon fin blocks 50 will be removed, leaving the outside portions as the fins. Thus, the difference between dimension 56 and the thinner dimension 53 shown in FIG. 2 sets the thickness of the fins.

Figure 2:
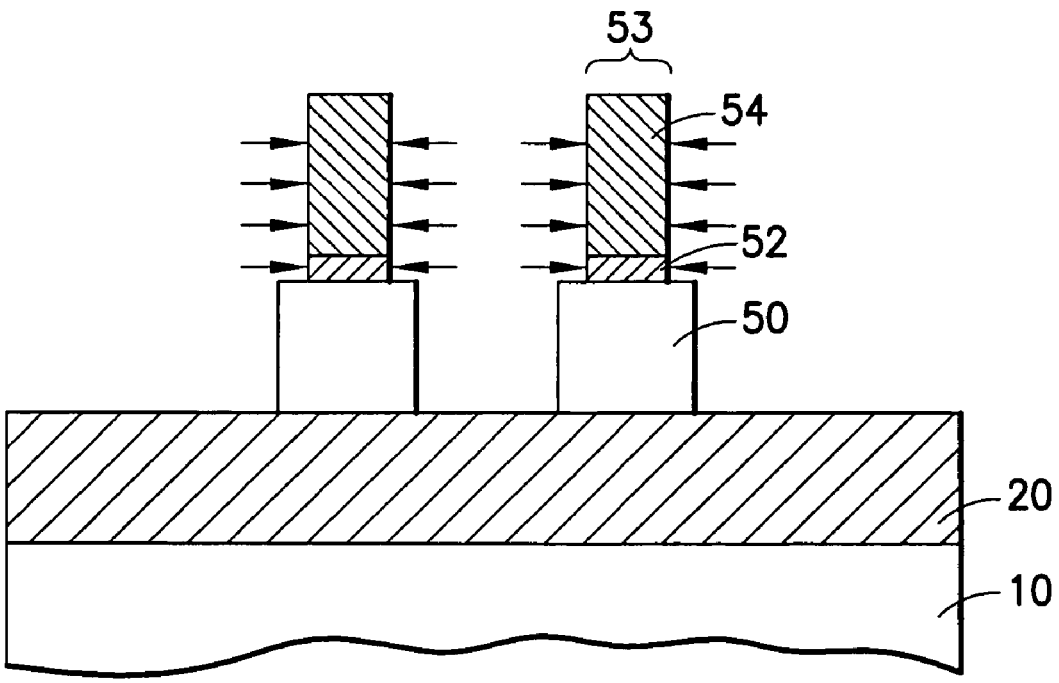
FIG. 2 shows the same area after a pull-back operation that reduces the width of the hardmask.

Referring now to FIG. 2, the pad nitride 54 is pulled back using a wet etch process (e.g. HF EG (hydrofluoric acid mixed with ethylene glycol)) or an isotropic plasma etch selective to silicon. The amount of pullback on either side of nitride cap 54 defines the fin body thickness later in the process.

A typical composition of the etching fluid is about 25 parts EG to 1 part of 49% HF at 80 degrees C. The composition and temperature are not critical and a wide range of parameters is satisfactory.

HF EG also pulls the oxide back. This is not critical as there will be an oxide deposited on top of it later.

It is an advantageous feature of the invention that the pull back step is not required to etch the nitride 54 and the oxide 52 at exactly the same rate, which would be very difficult to achieve.

Figure 3A:
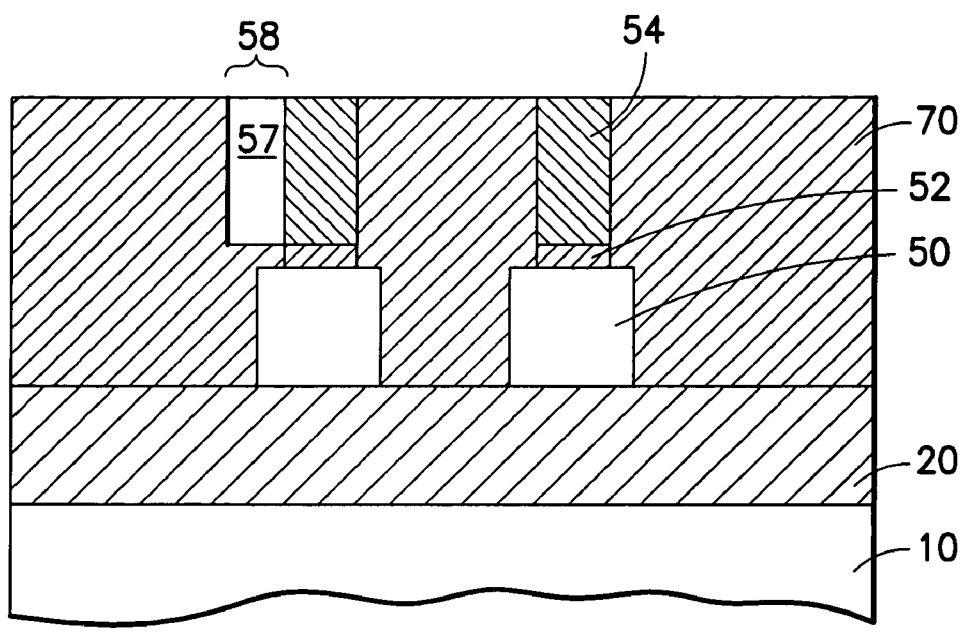
FIG. 3A shows the area after an optional step to remove one of the fins, producing an odd number of fins.
Figure 3B:
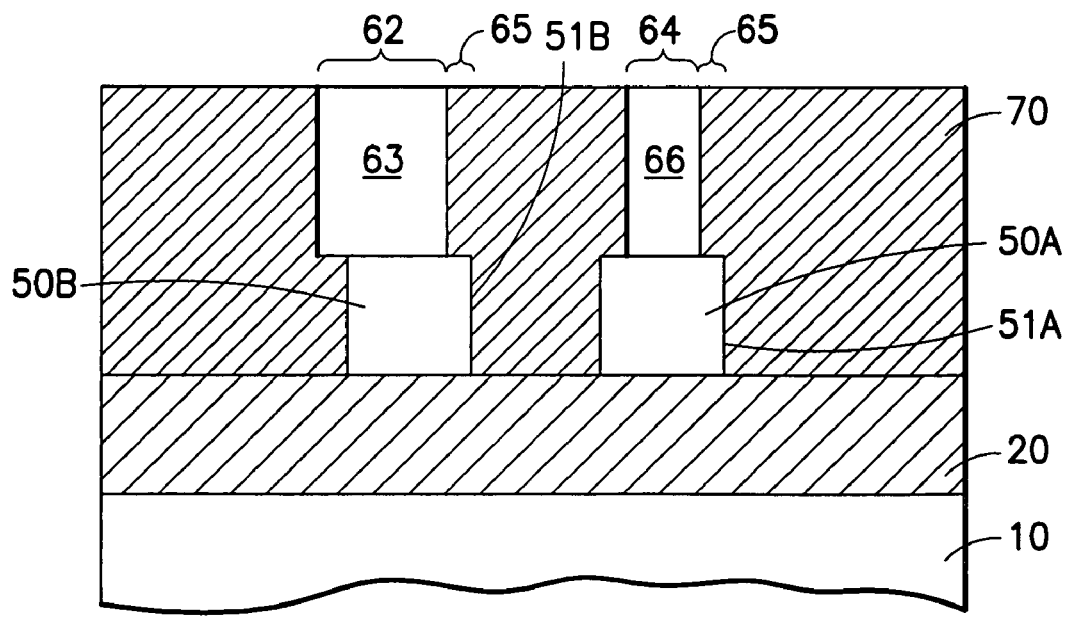
FIG. 3B shows the area after stripping the hardmask.

In FIGS. 3A and 3B, a CVD oxide film 70 (e.g. TEOS) has been deposited to fill the spaces between the silicon blocks 50. Oxide 70 is then planarized down to the nitride 54 on top of the oxide/silicon by chemical-mechanical polishing (CMP) or any other known planarization technique. This oxide 70 has preferably a higher wet or plasma etch rate than the BOX, so that the BOX will function as an etch stop in a future oxide etch. Film 70 is referred to as a second hardmask.

FIG. 3A also shows the result of an optional lithography step that is used to open up an etch window 57 to etch oxide on one side of the nitride/oxide/silicon block structure. This fin-removal step is convenient to be able to process an odd amount of fins for better current quantization for the FinFET. Those skilled in the art are aware that one FinFET transistor can be formed from several fins connected in parallel. The circuit designer will calculate the current required for each transistor and specify the number of fins required to produce that current. If the fins are processed using a pullback process, as shown here, two fins are formed for each nitride/oxide/silicon block.

If the circuit is not sensitive to the amount of transistor current, it may be preferable to have an arrangement with only even numbers of fins. The fin-removal step shown in preparation in FIGS. 3A and 3B will be used when the extra cost of the litho step is required by the demands of the circuit.

The result of the step shown is that the fin below aperture 57 that would have been defined in FIG. 4 will be removed (or not defined), leaving one fin for that block. The oxide etch for aperture 57 is timed and has to etch down at least to the oxide 52 level below the nitride 54 on top of the silicon.

Next, as shown in FIG. 3B, the nitride 54 is removed using a wet etch (e.g. hot phosphoric acid) or a plasma etch. In the same FIG. 3B, the oxide on top of the silicon is removed by an oxide RIE etch. This etch should be very anisotropic to avoid significant lateral removal of the oxide 70 overlapping the silicon. For convenience in exposition, brackets 65 denote the nominal width of the fins to be formed in silicon blocks 50 B in one case set by the difference in the edges of aperture 66 and the edges of block 50 Å and in the other, by the difference in one edge of aperture 63 and edge 51B of block 50B. The width 64 of aperture 66 has been set by the reduced width 53 of the nitride caps (see FIG. 2). A different reference numeral is used to emphasize that the two dimensions are not exactly equal.

In practice, the pullback of oxide 52 will not be exactly the same as that of nitride 54, so aperture 66 will be slightly larger or smaller as it passes through the former location of layer 52 than the portion of aperture 66 that passes through layer 54. It is advantageous that this difference does not matter.

If aperture 66 is larger, for example, as it passes through the former location of layer 52 than it is higher up, the directional nature of the etch means that the aperture cut in the silicon 50 is not increased in width by the wider aperture in the former location of layer 52 above it. If the aperture 66 in that location is smaller, the etch through layer 50 will be delayed at the edges by etching through the edge of layer 52 that should have been removed. This will leave some residual silicon at the bottom of the aperture, but a standard overetch will clean up the bottom corners of the aperture in layer 50.

Variation in the magnitude of dimension 64 would be another variable in fin body thickness control and would reduce uniformity in the final product. If, in a particular application, it is not practical to eliminate horizontal etching of oxide 70 during the step of removing oxide 52, the nitride pullback can be reduced in magnitude such that the net dimension 64 is correct, since a lateral etch component can be considered as a fixed bias and compensated for.

It has been found that, for a process having a 90 nm groundrule, variation in final fin thickness was 3% lot to lot (1 sigma) and that variation within a wafer was only 1%.

Those skilled in the art will readily appreciate that this improvement in uniformity will result in improved circuit performance.

On the left of FIG. 3B, aperture 63 has a right edge that is offset from edge 51B of silicon block 50B by substantially the same amount as the offset between the right edge of aperture 66 and edge 51A of silicon 50 Å. The position of the left edge of aperture 63 is not critical in this case.

FIG. 4 shows the result of etching, in a conventional RIE etch, silicon blocks 50 selective to oxide, using oxide 70 as a mask. Again, it is important that the RIE etch produces substantially straight (e.g. substantially perpendicular to the horizontal surface of silicon blocks 50) silicon side walls of fins 55, so that the dimension 65 is uniform. Because of aperture 57 in FIG. 3A, there is only one fin in the left aperture.

Thus, the process discussed thus far (illustrated in FIGS. 1B 4) involves defining blocks of silicon that have a width equal to the distance between outer edges of a pair of fins to be defined in silicon blocks 50. The hardmask (nitride 54 and oxide 52) used in that step is pulled back on each side by an amount proportional in width to the width of a fin. The amount of pullback on each side in general will not be exactly equal because there may be some etch bias from other processes.

Figure 5:
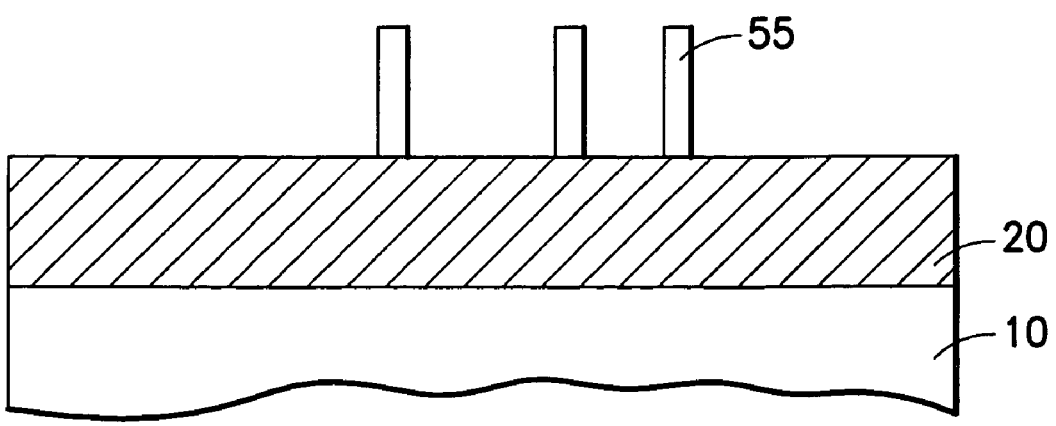
FIG. 5 shows a set of fins ready for formation of the transistor gates.

FIG. 5 shows the result of removing oxide 70 using a wet etch (e.g. HF) or plasma etch, so that silicon fin structures 55 remain. The etch process is selective to silicon and to the BOX. A typical fill material of LPCVD TEOS oxide etches more than four times as fast as thermal oxide in HF, so that there is a clear difference between the fill and the BOX.

The process continues with the selfaligned source/drain SARC2 process flow as shown in copending patent application YOR920030380, incorporated by reference in its entirety, or with any other conventional process for putting a gate on a FinFET.

The remaining Figures illustrate an alternative process that is generally similar to the previously described process flow.

The starting point is the same as that described in FIG. 1, with a SOI or silicon bulk substrate and an oxide and nitride stack.

Figure 6:
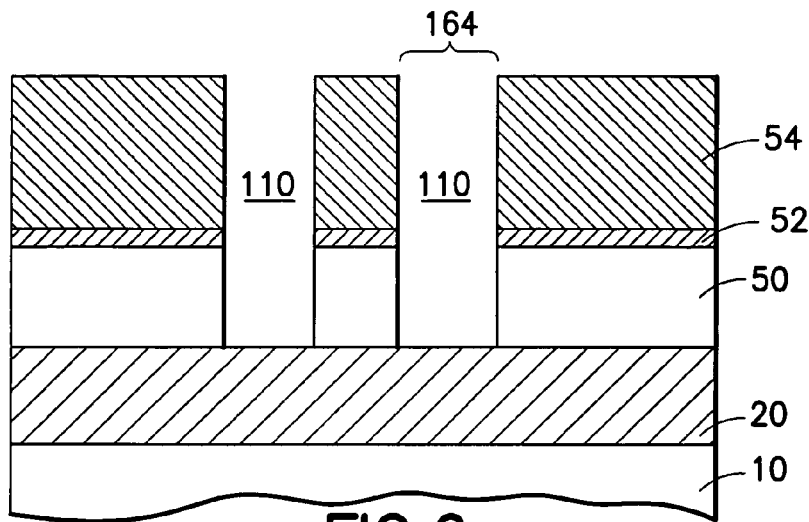
FIG. 6 shows a first step in an alternative method.

In FIG. 6, the same basic wafer structure with substrate 10, BOX 20, SOI layer 50, pad oxide 52 and pad nitride 54 has been patterned with the opposite polarity compared to the embodiment described in FIG. 1. Here the block area is etched, while in the previous embodiment, the block area was remaining. Two fin separation apertures 110, having a width 164, illustratively the same as width 64 in the previous version, have been etched down to BOX 20.

Figure 7:
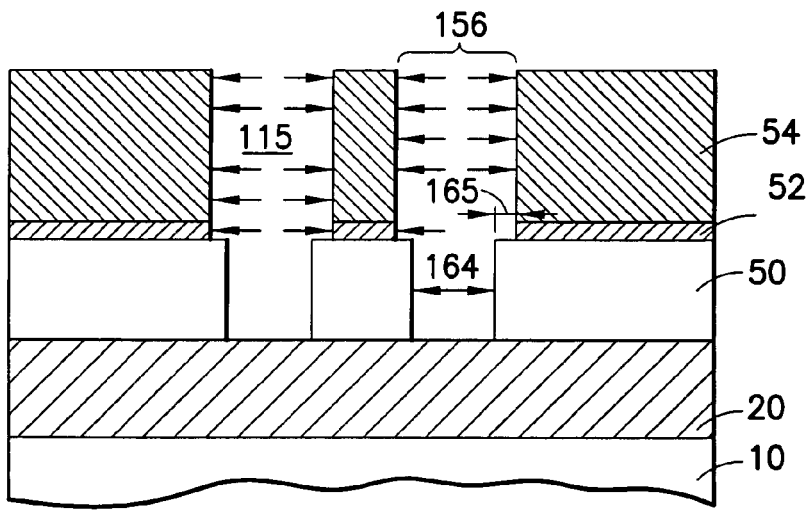
FIG. 7 shows widening the aperture.

FIG. 7 shows the nitride pullback to form apertures 115, using the same technology as in FIG. 2. The result of this step is that the lower portion of apertures 115 has the dimension 164 of the spacing between fins and the upper portion of aperture 115 has been expanded to have the spacing 156 between edges that is the outside-to-outside dimension of a pair of fins. Dimension 165 (the amount of nitride pullback) is the thickness of the fins to be formed in SOI 50 in subsequent processing steps.

Figure 8:
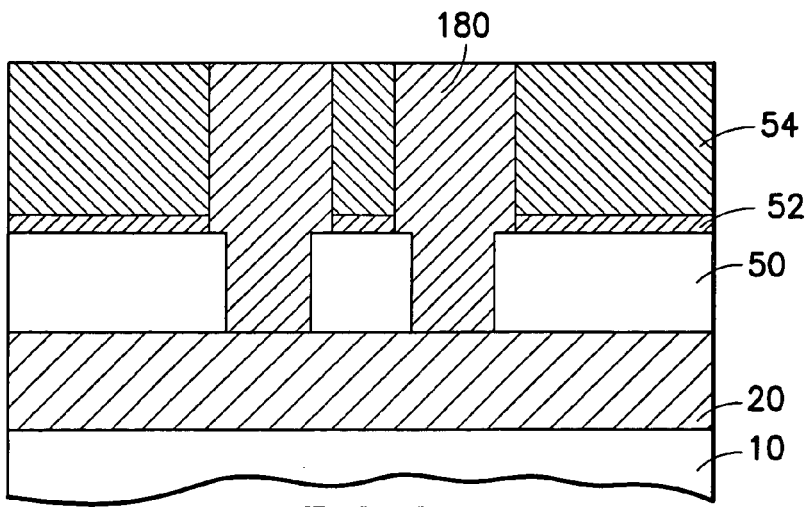
FIG. 8 shows filling the aperture with a second hardmask.

FIG. 8 shows the result of depositing and planarizing another layer of oxide 180, filling the aperture 115. Oxide 180 will be the hardmask to define the outer edges of the fins. At this point it would be also possible to generate an odd amount of fins by using the same processes as described in FIGS. 3A and 3B.

Figure 9A:
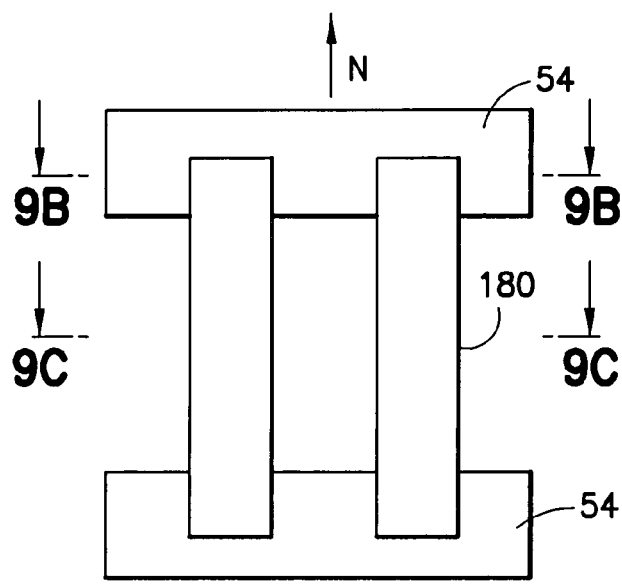
FIGS. 9A, 9B and 9C show cross sections at the end and middle of the fins after stripping the nitride.
Figure 9B:
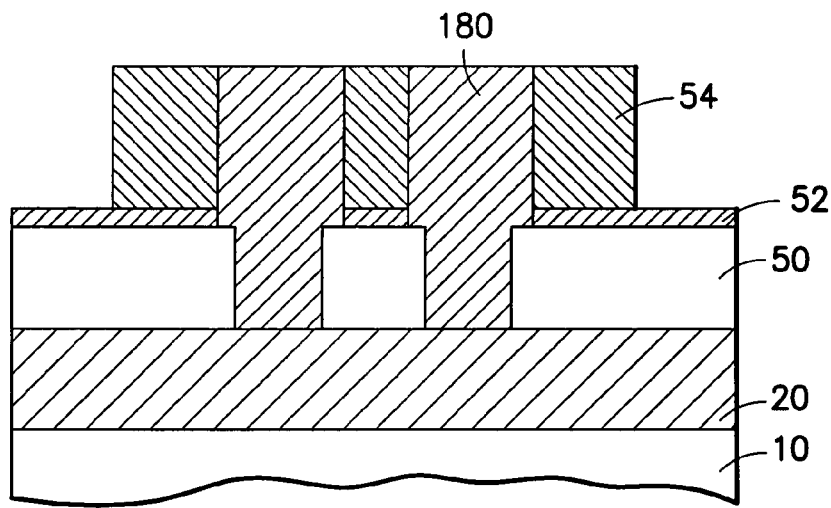
Figure 9C:
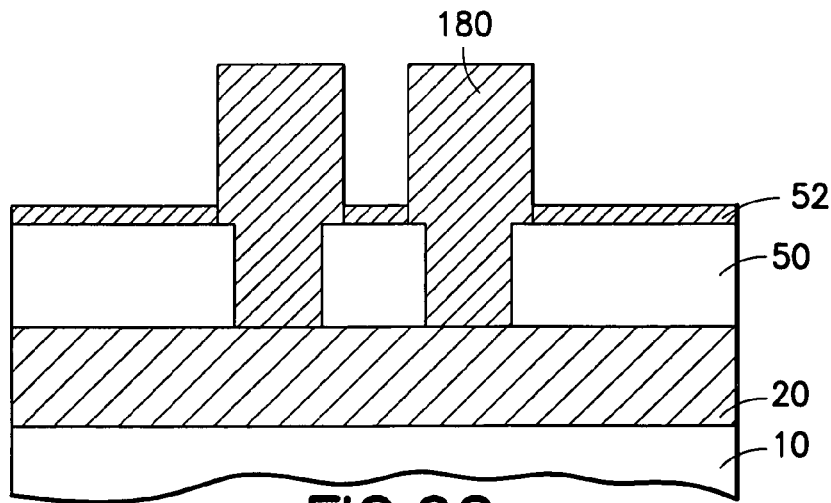

FIGS. 9A, 9B and 9C show an alternative step that applies to both embodiments in which the source/drain blocks 50 are lithographically structured. This step may be performed before FIG. 1 in the present disclosure. FIG. 9A shows a top view, with two oxide blocks 180 extending North-South and two blocks 54 that extend E-W and cover the ends of the fins. The final fins will be formed under the N-S edges of blocks 180. FIG. 9A is shown after a preliminary step of etching apertures through nitride 54, oxide 52 and silicon 50 and filling them with oxide to form blocks 180. FIG. 9 also includes two cross sections indicated as 9B and 9C. In this step, the nitride 54 has been etched in the middle of the structure, where the gate will be placed and along line 9C, using an oxide selective RIE. The nitride 54 remains as a hardmask in the source/drain block areas at the top and bottom of FIG. 9A, where it prevents the silicon etching in a later step from cutting the East-West cross connections between fins. The purpose of this optional step is to tie together the sources and drains of a set of fins that collectively form a transistor with higher current capacity than an individual fin can carry. The word Aset@ means one or more, as used in the following claims, which are not restricted to pairs of fins.

FIG. 9C shows that oxide blocks 180 have been formed, projecting above oxide 52 on top of the silicon layer 50. Blocks 180 will serve as a hardmask in the subsequent oxide/silicon etching step that will define the fins. FIG. 9B shows that the nitride remains at the N and S ends of the structure, so that an E-W portion of layer 50 will remain to connect pairs of fins in that region. Those skilled in the art will readily be able to adapt the process of FIGS. 1B 4 to preserve the E-W portion of layer 50 at the ends of the fins.

Figure 10A:
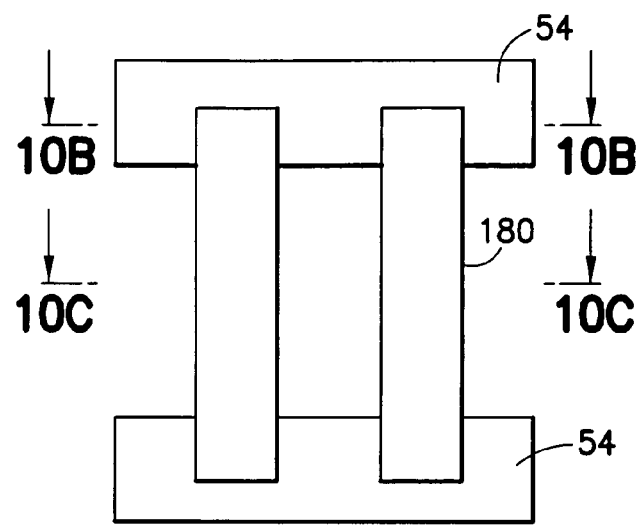
FIGS. 10A, 10B and 10C show cross sections at the end and middle of the fins after etching the device layer.
Figure 10B:
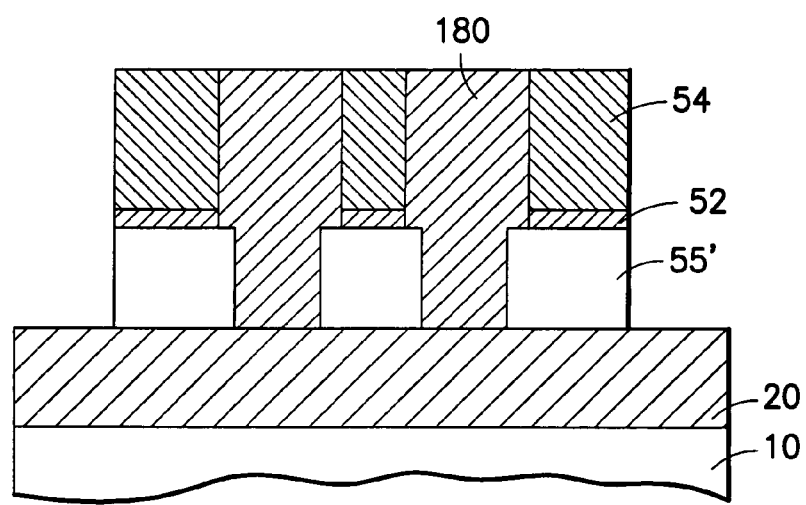
Figure 10C:
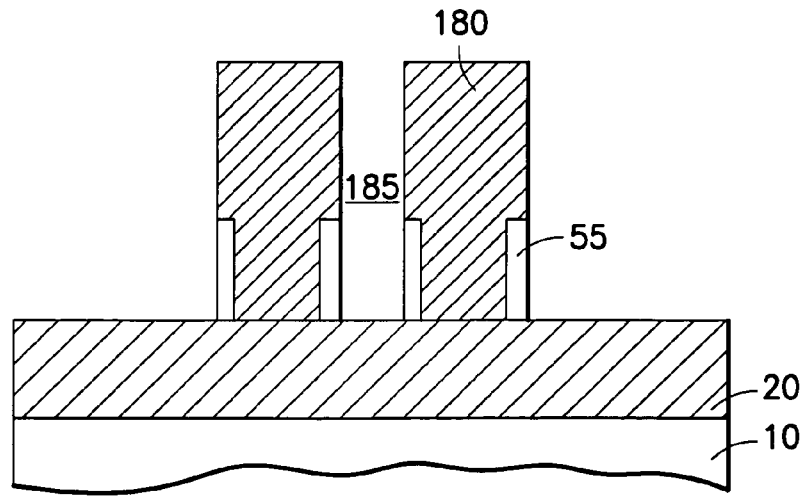

In FIG. 10C, the oxide 52 on top of the silicon 50 has been etched and the silicon 50 has been removed outside the fin area, thus defining four fins 55. FIG. 10 Å shows again the top view. FIG. 10B shows that the N and S ends of the structure are unchanged, protected by the hardmask formed by oxide 180 and nitride 54 and any residual amount of the block of resist that was present in the previous step. Since layer 52 is much thinner than block 180, it does not matter if some of block 180 is removed during the removal of layer 52. FIG. 10B also shows that the oxide/silicon layer has been trimmed outside the hardmask. FIG. 10C shows the resulting structure after oxide 52 and SOI 50 in FIG. 9C have been etched, with oxide 180 acting as a hardmask. Since a highly directional etch is used in forming the fins, a slight lateral etch of oxide will not be significant (and may be treated as a bias in setting the width of block 180). Similar to the previous embodiment (e.g. FIG. 5), fins 55 are formed by etching the silicon blocks 50. Summarizing, oxide 180 filled the widened aperture 115 to protect one side of the fin blocks and the fins 55 were defined by the same silicon etch process as before.

The step next following FIG. 10 will be the removal of the oxide 180. Oxide 180 has been a deposited oxide, illustratively TEOS, which etches in conventional processes at faster rate than the BOX, so that the process can rely on the differential etch rate to permit exposing the BOX to an oxide etch.

Figure 11A:
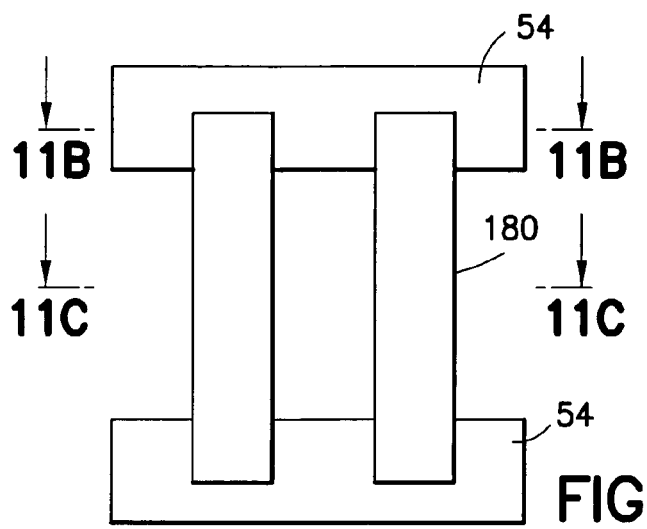
FIGS. 11A, 11B and 11C show cross sections at the end and middle of the fins after depositing an alternative layer.
Figure 11B:
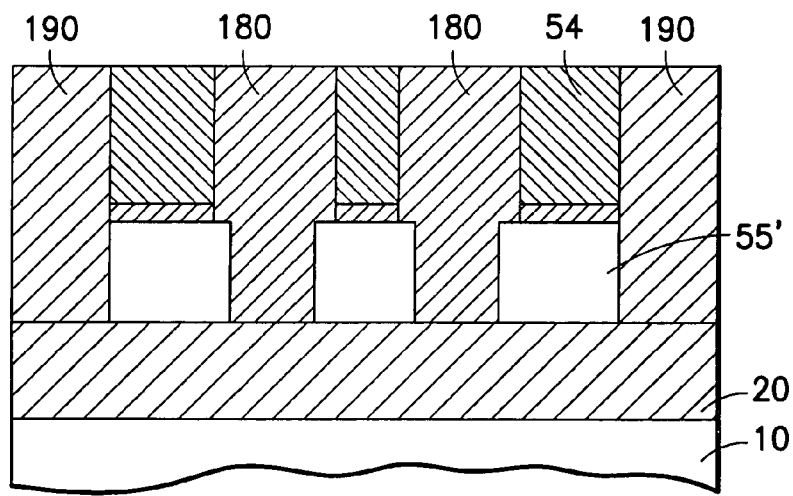
Figure 11C:
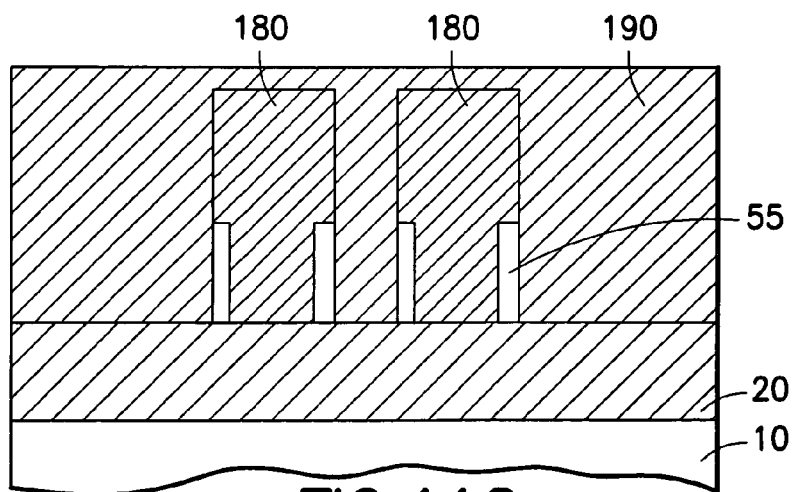

FIG. 11 shows an alternative way to remove the deposited oxide 180 between the silicon structures, in case the oxide selectivity between the deposited oxide and the BOX 20 is too low. In the alternative method, an additional CVD oxide 190 is deposited and planarized the same way as described above, so that FIG. 11C shows the oxide 180 surrounded by the new oxide 190. This process flow also prevents the silicon fins from being exposed during the nitride etch in the next step. A nitride etch, for example in hot phosphoric acid, can result in surface pitting. If the nitride is removed using another silicon and oxide selective etch, e.g. a plasma etch, these steps are not necessary.

Figure 12A:
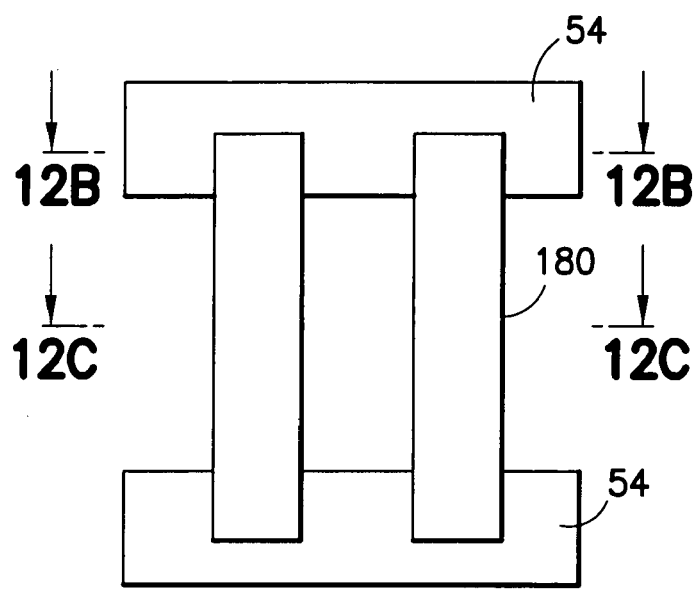
FIGS. 12A, 12B and 12C show cross sections at the end and middle of the fins after cleaning up residual oxide.
Figure 12B:
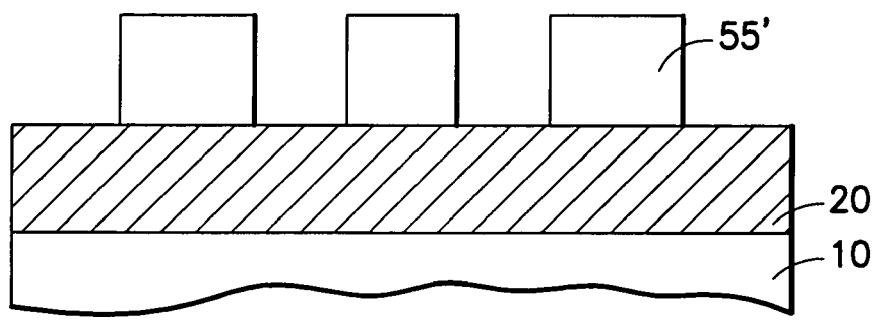
Figure 12C:
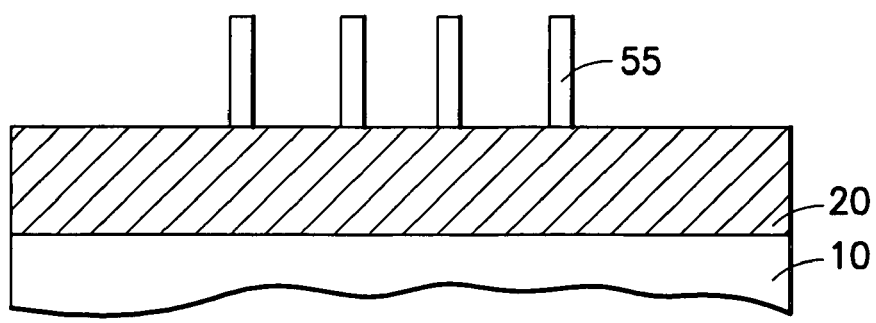

FIG. 12 shows the result of a cleanup operation in which the nitride 54 is etched and the oxides 190 and 180 are removed selective to silicon using an HF based etch chemistry, wet or vapor, or by oxide plasma etching. It is also possible to etch first part of the oxide (e.g. 190), then remove the nitride 54, followed by another oxide etch down to the BOX. This prevents overetching into the BOX during the oxide etch. FIG. 12C shows the separated fins 55 and FIG. 12B shows the connecting block 55=connecting pairs of fins.

Each of the described processes then continues with a standard FinFET process such as that described in J. Kedzierski et al., IEEE Transactions on Electron Devices v.50 n.4 Apr. 2003 p.952–958, or any other convenient method of putting down gates on the fins and then performing standard back end processing, well known to the art.

While the invention has been described in terms of a single preferred embodiment, those skilled in the art will recognize that the invention can be practiced in various versions within the spirit and scope of the following claims.

What is claimed is:

1. A method of forming at least one fin extending from a substrate comprising the steps of:
   providing a fin layer of semiconductor on said substrate;
   depositing a first hardmask on said fin layer;
   patterning said fin layer to form at least one fin block;
   reducing the transverse dimensions of said first hardmask above said at least one fin block by an amount greater than or equal to the thickness of two fins;
   forming a second hardmask about and adjacent to said first hardmask;
   removing said first hardmask, leaving at least one etch aperture in said second hardmask having a width equal to a fin separation distance between adjacent fins; and
   etching said fin layer through said at least one aperture to form said at least one fin.

2. A method according to claim 1, in which said step of reducing comprises etching vertical sides of said first hardmask with a wet etch.

3. A method according to claim 2, in which said first hardmask comprises a layer of nitride above a layer of oxide.

4. A method according to claim 3, in which said fin layer comprises silicon and said wet etch is a mixture of HF and EG.

5. A method according to claim 1, further comprising a step of lithographically defining an aperture extending over one side of a member of a set of fin blocks after said step of forming said second hardmask and before said step of removing said first hardmask.

6. A method according to claim 2, further comprising a step of lithographically defining an aperture extending over one side of a member of a set of fin blocks after said step of forming said second hardmask and before said step of removing said first hardmask.

7. A method according to claim 1, further comprising a step of lithographically defining a blocking mask over an end portion of said set of fin blocks, thereby preventing said end portion of said set of fin blocks from being separated.

8. A method according to claim 2, further comprising a step of lithographically defining a blocking mask over an end portion of said set of fin blocks, thereby preventing said end portion of said set of fin blocks from being separated.

9. A method according to claim 5, further comprising a step of lithographically defining a blocking mask over an end portion of said set of fin blocks, thereby preventing said end portion of said set of fin blocks from being separated.

10. A method of forming a set of fins extending from a substrate comprising the steps of:
    providing a fin layer of semiconductor on said substrate;
    depositing a first hardmask on said fin layer and forming at least one aperture in said first hardmask;
    patterning said fin layer through said first hardmask, thereby extending said at least one aperture into said fin layer and defining two fin blocks flanking said at least one aperture in said fin layer;
    expanding the transverse dimension of said at least one aperture in said first hardmask relative to the transverse dimension of said at least one aperture in said fin layer by removing a portion of said first hardmask above each of said two fin blocks, thereby exposing a corresponding portion of each of said two fin blocks with a predetermined width;
    forming a second hardmask within said at least one etch aperture;
    removing said first hardmask; and
    patterning said fin layer through said second hardmask to form at least one fin with said predetermined width from each of said two fin blocks.

11. A method according to claim 10, in which said step of expanding comprises etching substantially vertical sides of said first hardmask with a wet etch.

12. A method according to claim 11, in which said first hardmask comprises a layer of nitride above a layer of oxide.

13. A method according to claim 12, in which said fin layer comprises silicon and said wet etch is a mixture of HF and EG.

14. A method according to claim 10, further comprising a step of lithographically defining an aperture adjacent to one side of said second hardmask after said step of forming said second hardmask and before said step of removing said first hardmask.

15. A method according to claim 11, further comprising a step of lithographically defining an aperture adjacent to one side of said second hardmask after said step of forming said second hardmask and before said step of removing said first hardmask.

16. A method according to claim 10, further comprising a step of lithographically defining a blocking mask over an end portion of said set of fin blocks, thereby preventing said end portion of said set of fin blocks from being separated.

17. A method according to claim 11, further comprising a step of lithographically defining a blocking mask over an end portion of said set of fin blocks, thereby preventing said end portion of said set of fin blocks from being separated.

18. A method according to claim 14, further comprising a step of lithographically defining a blocking mask over an end portion of said set of fin blocks, thereby preventing said end portion of said set of fin blocks from being separated.

19. A method of forming a set of fins extending from a substrate comprising the steps of:
    providing a substrate with a fin layer of semiconductor;
    depositing a first hardmask on said fin layer;
    patterning said fin layer with a set of fin separation apertures;
    expanding the transverse dimensions of said fin separation apertures above said fin layer by an amount greater than or equal to the thickness of two fins;
    filling said fin separation apertures with a second hardmask;

removing said first hardmask, leaving a set of etch apertures in said second hardmask having a width equal to a fin separation distance between adjacent fins; and etching said fin layer through said etch apertures to form said set of fins.

20. A method according to claim 19, in which said step of expanding comprises etching substantially vertical sides of said first hardmask with a wet etch.

21. A method according to claim 20, in which said fin layer comprises silicon and said wet etch is a mixture of HF and EG.

22. A method according to claim 19, further comprising a step of lithographically defining an aperture extending over one side of a member of a set of fin blocks after said step of forming said second hardmask and before said step of removing said first hardmask.

23. A method according to claim 20, further comprising a step of lithographically defining an aperture extending over one side of a member of a set of fin blocks after said step of forming said second hardmask and before said step of removing said first hardmask.

24. A method according to claim 19, further comprising a step of lithographically defining a blocking mask over an end portion of said set of fin blocks, thereby preventing said end portion of said set of fin blocks from being separated.

25. A method according to claim 20, further comprising a step of lithographically defining a blocking mask over an end portion of said set of fin blocks, thereby preventing said end portion of said set of fin blocks from being separated.

26. A method according to claim 24, further comprising a step of lithographically defining a blocking mask over an end portion of said set of fin blocks, thereby preventing said end portion of said set of fin blocks from being separated.

* * * * *